(12) United States Patent
Kuo et al.

(10) Patent No.: US 8,273,633 B2
(45) Date of Patent: Sep. 25, 2012

(54) METHOD OF ENHANCING DOPANT ACTIVATION WITHOUT SUFFERING ADDITIONAL DOPANT DIFFUSION

(75) Inventors: Keh-Chiang Kuo, Taipei County (TW); Chien-Hao Chen, Yilan County (TW); Chun-Feng Nieh, Hsinchu County (TW); Li-Ping Huang, Taipei (TW); Hsun Chang, Hsinchu (TW); Li-Ting Wang, Tainan (TW); Chih-Chiang Wang, Hsinchu (TW); Tze-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 833 days.

(21) Appl. No.: 11/690,869

(22) Filed: Mar. 26, 2007

(65) Prior Publication Data
US 2008/0242039 A1    Oct. 2, 2008

(51) Int. Cl.
*H01L 21/336* (2006.01)
(52) U.S. Cl. .................. 438/308; 438/530; 257/E21.349

(58) Field of Classification Search .......... 438/142–308, 438/529; 257/E21.349, E21.475
See application file for complete search history.

(56) References Cited

U.S. PATENT DOCUMENTS

| | | | | |
|---|---|---|---|---|
| 4,151,008 A | * | 4/1979 | Kirkpatrick | 438/530 |
| 7,247,535 B2 | * | 7/2007 | Jain | 438/233 |
| 7,279,405 B2 | * | 10/2007 | Itani et al. | 438/530 |
| 7,598,162 B2 | * | 10/2009 | Yamamoto et al. | 438/528 |
| 2005/0247977 A1 | * | 11/2005 | Noda | 257/347 |
| 2006/0199345 A1 | * | 9/2006 | Mineji | 438/305 |

* cited by examiner

*Primary Examiner* — Chandra Chaudhari
(74) *Attorney, Agent, or Firm* — Thomas|Kayden (57) ABSTRACT

A method of enhancing dopant activation without suffering additional dopant diffusion, includes forming shallow and lightly-doped source/drain extension regions in a semiconductor substrate, performing a first anneal process on the source/drain extension regions, forming deep and heavily-doped source/drain regions in the substrate adjacent to the source/drain extension regions, and performing a second anneal process on source/drain regions. The first anneal process is a flash anneal process performed for a time of between about 1 millisecond and 3 milliseconds, and the second anneal process is a rapid thermal anneal process performed for a time of between about 1 second and 30 seconds.

7 Claims, 7 Drawing Sheets

METHOD OF ENHANCING DOPANT ACTIVATION WITHOUT SUFFERING ADDITIONAL DOPANT DIFFUSION

TECHNICAL FIELD

The present invention relates to methods of forming semiconductor devices, and particularly to a MOS transistor fabrication method for enhancing dopant activation without suffering additional dopant diffusion.

BACKGROUND

Continued device scaling requires the formation of ever-shallower, low-resistivity junctions. It is desirable to form these junctions using ion implantation and rapid thermal annealing (RTA) which has the ability to activate the implanted impurities for electricity conduction in silicon and remove implant damage sufficiently. For example, the conventional method of forming source/drain regions and/or source/drain extension regions involves implanting boron ions as p-type dopants or phosphorous ions as n-type dopants. The implantation is performed at low energy levels to achieve a shallow junction depth. The resulting structure is then annealed, typically at about 1000° C.~1050° C. to activate dopants. However, the conventional use of RTA for the duration of several seconds has a high thermal budget that would inevitably result in additional dopant diffusion and hence restrict silicon device downscaling. In addition, achievement of a small junction depth is problematic, especially for a p$^+$ region formed using boron ions. It has been found that during dopant activation anneal, boron diffusion in the crystalline silicon layer is significantly large, so that the junction depth of the boron tends to be much deeper than planned. The RTA technique, typically includes quickly raising the temperature of the wafer and holding it at that temperature for a time long enough to successfully perform a fabrication process, while avoiding such problems as unwanted dopant diffusion that would otherwise occur at the high processing temperatures.

What is needed in the art, therefore, is a novel thermal approach for enhancing dopant activation and maintaining low thermal budget simultaneously to minimize dopant diffusion.

SUMMARY OF THE INVENTION

Embodiments of the present invention include a thermal approach to activate impurities in silicon without suffering additional dopant diffusion. A MOS transistor fabrication method uses a flash anneal process performed on source/drain extension regions before a source/drain implantation followed by a rapid thermal anneal (RTA) step.

In one aspect, the present invention provides a method of forming a semiconductor device, comprising the steps of: providing a semiconductor substrate having a gate structure patterned thereon; performing a first ion implantation process to form source/drain extension regions in the semiconductor substrate on opposing sides of the gate structure; performing a first anneal process on the source/drain extension regions; forming dielectric spacers on sidewalls of the gate structure respectively; performing a second ion implantation process with the gate structure and the dielectric spacers as the mask to form source/drain regions in the semiconductor substrate; and performing a second anneal process on the source/drain regions. The first anneal process is a flash anneal process performed for a time of between about 1 millisecond and 3 milliseconds, and the second anneal process is a rapid thermal anneal process performed for a time of between about 1 second and 30 seconds.

In another aspect, the present invention provides a method of forming a semiconductor device, comprising the steps of: providing a semiconductor substrate having a gate structure patterned thereon; performing a first ion implantation process to form source/drain extension regions in the semiconductor substrate on opposing sides of the gate structure; performing a first anneal process on the source/drain extension regions; forming dielectric spacers on sidewalls of the gate structure respectively; performing a second ion implantation process with the gate structure and the dielectric spacers as the mask to form source/drain regions in the semiconductor substrate; and performing a second anneal process on the source/drain regions. The first anneal process is a laser anneal process, and the second anneal process is a rapid thermal anneal process.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

The present invention provides a thermal approach to activate impurities in silicon without suffering additional dopant diffusion. Preferred embodiments provide a MOS transistor fabrication method using a flash anneal process performed on source/drain extension regions before a source/drain implantation followed by a rapid thermal anneal (RTA) step. As used throughout this disclosure, the term "flash anneal" refers to a surface heating technique that gives off light suddenly or substantially instantaneous (or in transient bursts) for duration of time between about 1 nanosecond and about 10 milliseconds.

Figure 1:
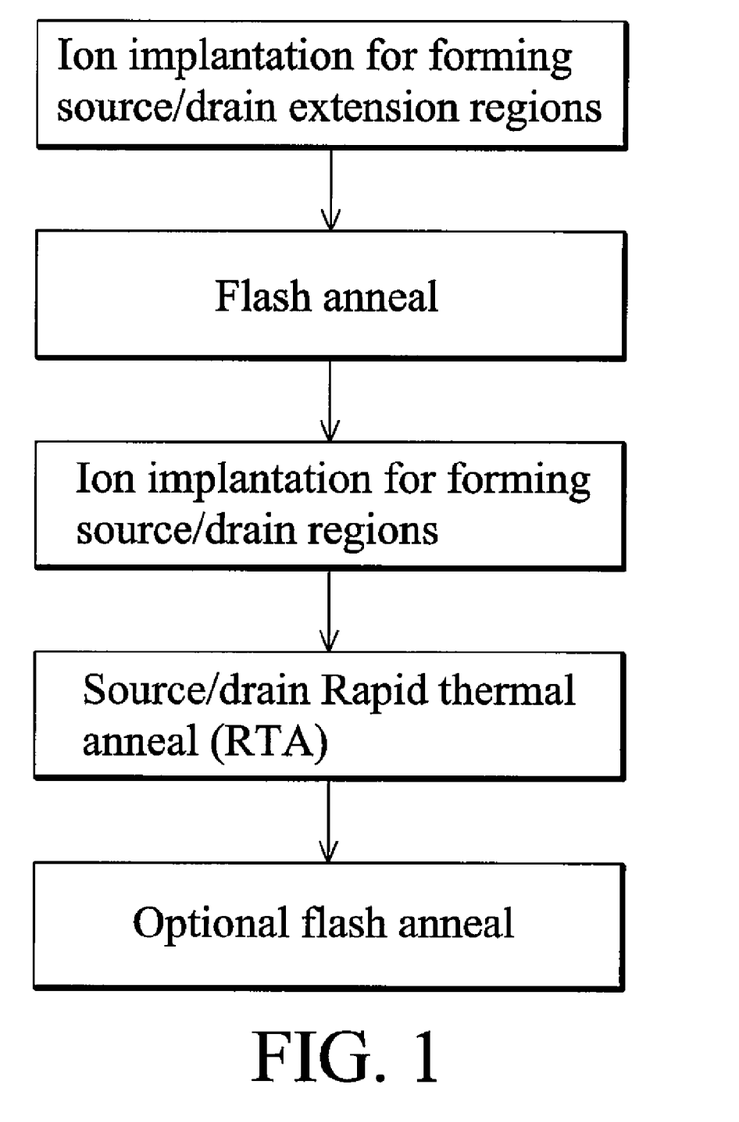
FIG. 1 is a process flow diagram of the present invention.

FIG. 1 is a process flow diagram of the present invention. The flash anneal process is performed between a source/drain extension implantation and a source/drain implantation followed by a source/drain RTA step. The flash anneal step can achieve p-n junctions with higher dopant activation, e.g., lower sheet resistance (Rs), and keep junction depth shallow simultaneously. This step affects neither the source/drain activation nor the polysilicon activation. The flash anneal process also reduces the thermal budget which is desirable particularly for shrinking device dimensions, thus improving device performance at 45 nm technology node and beyond. In addition, an optional flash anneal process can be performed after the source/drain RTA step to further increase dopant activation, and thus results in additional Rs reduction. In some embodiments, the flash anneal can be substituted by laser anneal, and the temperature of the source/drain RTA process can be lowered for junction depth control.

Compared with the conventional method of using source/drain RTA step only, the use of flash anneal for 1-3 milliseconds (msec) prior to the source/drain RTA step can reduce $R_S$ as much as 28%, and the use of optional flash anneal after the source/drain RTA step can result in additional 7% RS reduction. By this manner of using flash anneal in the MOS transistor fabrication method of the present invention, about 2% device gain can be obtained. Particularly, for boron ($B^+$) ion impanation cases, the present invention can achieve higher boron activation level to retain boron dosage and suppress boron ion diffusion. It has the advantages of better short channel control.

Figure 2A:
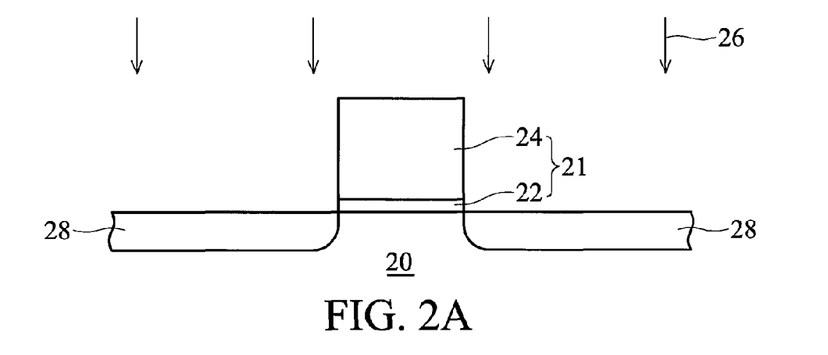
FIG. 2A to 2E are cross-sectional diagrams illustrating an exemplary embodiment of a MOS transistor fabrication method using a flash anneal process on source/drain extension regions prior to a source/drain RTA step.

FIG. 2A to 2E are cross-sectional diagrams illustrating an exemplary embodiment of a MOS transistor fabrication method using a flash anneal process on source/drain extension regions prior to a source/drain RTA step. In FIG. 2A, a semiconductor substrate 20 is provided with a gate structure 21 patterned thereon. The semiconductor substrate 20 is bulk silicon, but other commonly used materials and structures such as silicon on insulator (SOI) or a silicon layer overlying a bulk silicon germanium may also be used. The gate structure 21 includes a gate dielectric layer 22 and a gate electrode layer 24. The gate dielectric layer 22 may be formed of silicon oxide or a high-k dielectric material. The gate electrode layer 24 may be formed of amorphous polysilicon, doped polysilicon, metal, single crystalline silicon or other conductive materials. Prior to the formation of gate structure 21, the semiconductor substrate 20 may be provided with p-wells, n-wells, and shallow trench isolation structures, which are standard in the industry and omitted in FIG. 2A.

Referring to FIG. 2A, after the formation of the gate structure 21, a first ion implantation process 26 is performed to form source/drain extension regions 28, in which impurity ions are implanted into the substrate 20 to form lightly doped source/drain (LDD) regions adjacent to the gate structure 21. The dopant concentration in LDD regions is preferably between about $1E14/cm^2$ and about $1E16/cm^2$, and more preferably about $1E15/cm^2$. In one embodiment, prior to the source/drain extension implantation process, a dielectric spacer, such as an oxide layer, a nitride layer, an oxynitride layer, or combinations thereof, may be formed on the sidewalls of the gate structure so as to prevent gate oxide degradation during the implantation process. The formation details are well known in the art, thus are not repeated herein.

Figure 2B:
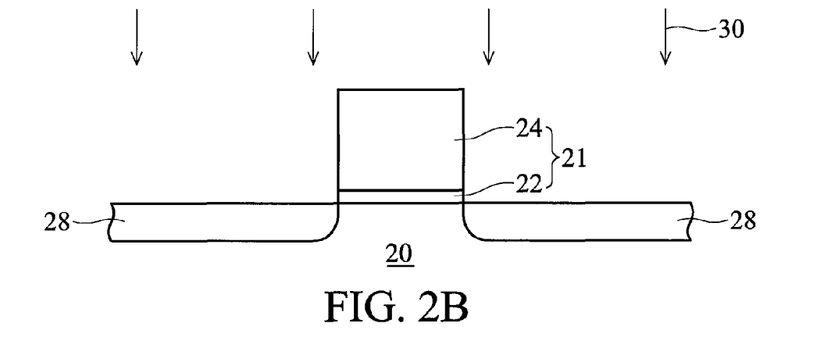

In FIG. 2B, a flash anneal process 30 is then performed on the source/drain extension regions 28 to activate impurities in the substrate 20. In the flash anneal process 30, a radiation energy source is a filament-less lamp, such as a Xe arc lamp in white-light wavelength area, which gives off light suddenly or substantially instantaneous for a duration of time between about 1~3 msec. In one embodiment, the flash anneal process 30 is performed on the source/drain extension regions 28 for the duration of about 0.8 msec. In one embodiment, the flash anneal process 30 can be substituted by a laser anneal process.

Figure 2C:
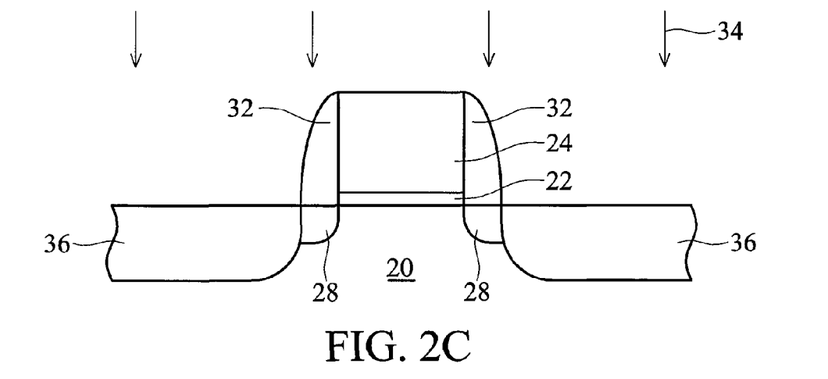

Next, in FIG. 2C, dielectric spacers 32 are formed on the sidewalls of the gate structure 21, and then a second ion implantation process 34 is performed to form source/drain regions 36. As is known in the art, the dielectric spacers 32 may be formed by blanket depositing a dielectric layer, then removing the dielectric layer from horizontal surfaces, and thus leaving spacers 31 along the sidewalls of gate structure 21. The dielectric spacers 32 may be formed of an oxide layer, a nitride layer, an oxynitride layer or combinations thereof, through the use of a CVD process and an anisotropically etch process. The second ion implantation process 34 uses the dielectric spacers 32 and the gate structure 21 as the mask to form the deep and heavily doped source/drain regions 36 on the shallow source/drain extension regions 28. The dopant concentration is preferably between about $5E15/cm^2$ and about $5E16/cm^2$. The dopants used to create the deep source/drain regions 36 for PMOS transistors are typically boron and for NMOS transistors are typically arsenic and phosphorus; however, other dopants or combinations for dopants may be used. In other embodiments, source/drain regions 36 are formed by recessing the source/drain regions, and then epitaxially growing semiconductor materials, such as silicon, germanium, carbon, and combinations thereof in the recesses. The desired impurities may be doped simultaneously with the epitaxial growth or may be implanted after the epitaxial growth.

Figure 2D:
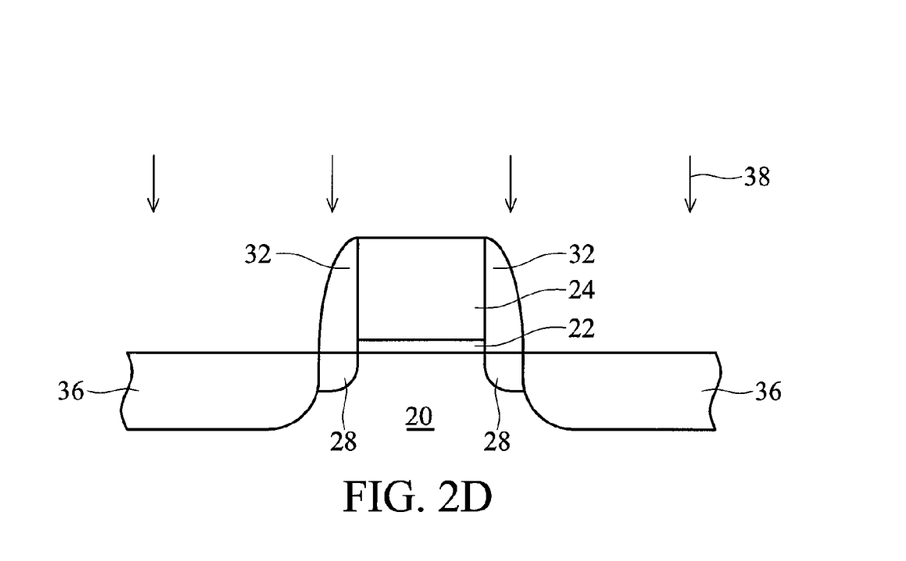
Figure 2E:
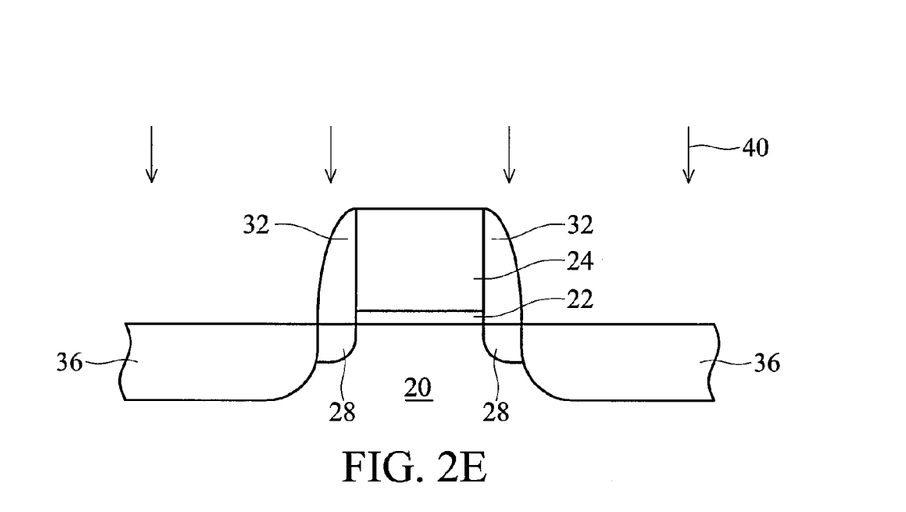

Referring to FIG. 2D, a post-implant anneal process 38 is performed to drive in the impurity ions. The post-implant anneal uses a rapid thermal anneal (RTA) process 38 at a temperature of between 900° C. and 1050° C. for a time of between about 1~30 seconds in a nitrogen containing atmosphere. In general, the RTA system uses a bank of Halogen lamps and reflectors to heat the bulk of the semiconductor wafer. In one embodiment, the temperature of the RTA process 38 can be lower than 900° C. for junction depth control. In FIG. 2E, an optional flash anneal process 40 may be provided after the RTA process 38 to further increase dopant activation, and thus results in additional Rs reduction. In one embodiment, the optional flash anneal process 40 can be substituted by a laser anneal process.

Figure 3A:
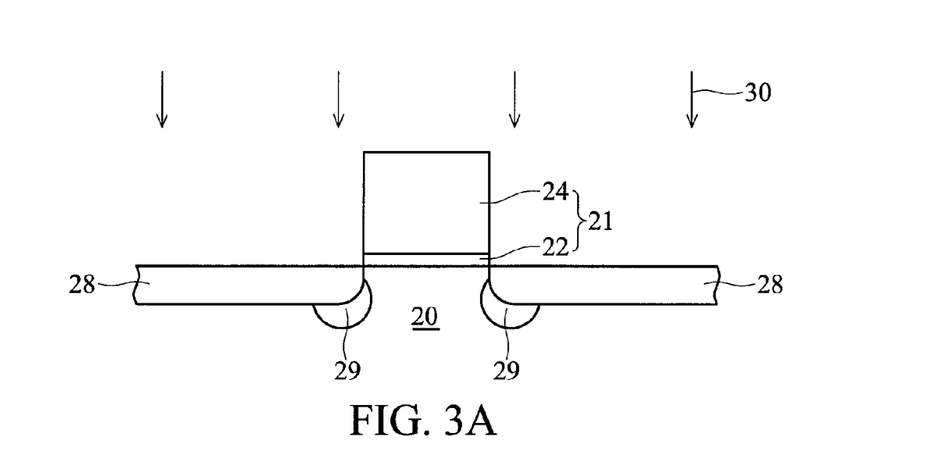
FIGS. 3A and 3B are cross-sectional diagrams illustrating an exemplary embodiment of thermal approach using a flash anneal process between a halo implantation and the source/drain RTA step.
Figure 3B:
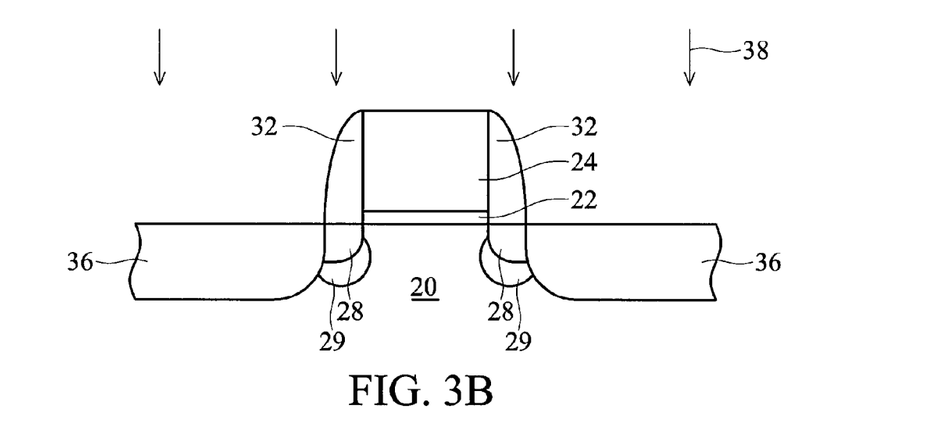

FIGS. 3A and 3B are cross-sectional diagrams illustrating an exemplary embodiment of thermal approach using a flash anneal process between a halo implantation and the source/drain RTA step, while explanation of the same or similar portions to the description in FIG. 2A-2E is omitted herein. In order to reduce the short channel effect, referring to FIG. 3A, after the formation of the source/drain extension regions 28 in the substrate 20 on opposite sides of the gate structure 21, halo regions 29 in contact with the source/drain extension regions 28 within the substrate 20 are formed by implanting impurity ions in a tilted direction with respect to the substrate 20. The halo regions 29 have a conductive type different from that of the source/drain extension regions 28. For example, when the source/drain extension regions 28 are formed by implanting p-type impurity ions (e.g., boron (B) or $BF_2$ ions), the halo regions 29 are formed by implanting n-type impurity ions (e.g., arsenic (As) ions). Next, in FIG. 3B, the dielectric spacers 32 and the source/drain regions 36 are formed followed by the RTA process 38. An optional flash anneal process or a laser anneal process may be provided after the RTA process 38 to further increase dopant activation, and thus results in additional $R_S$ reduction.

Figure 4A:
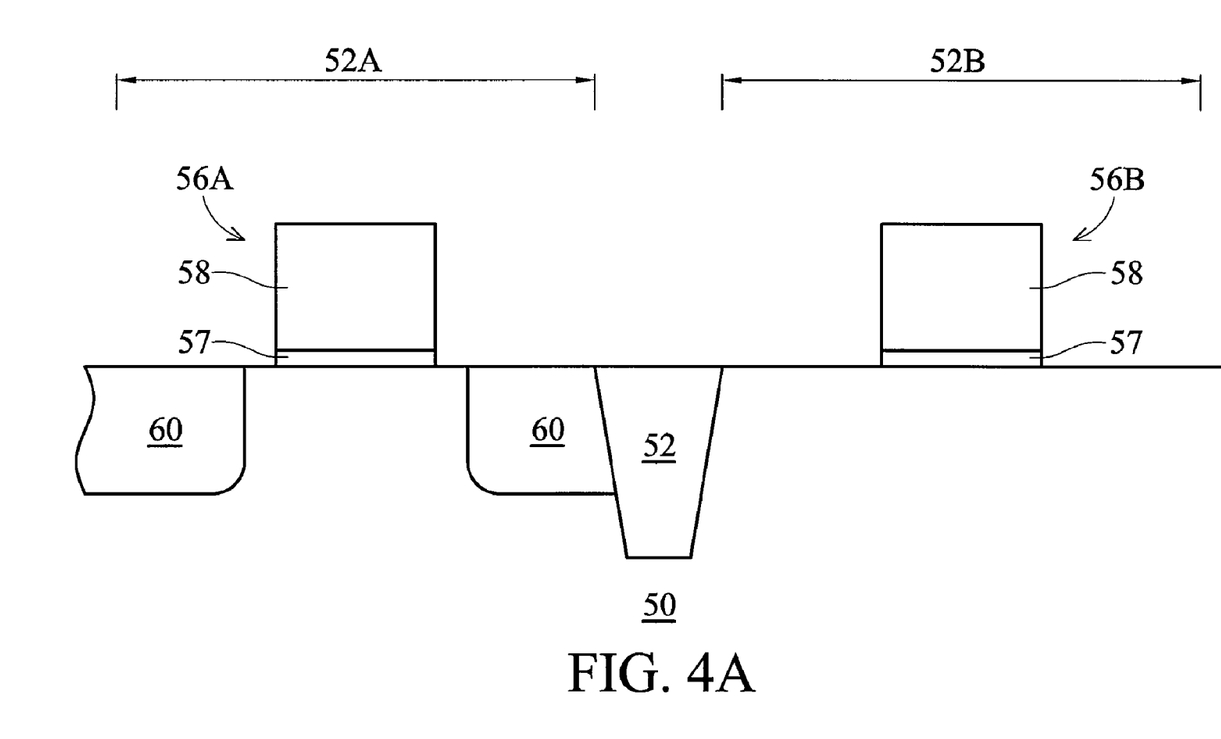
FIGS. 4A to 4C are cross-sectional diagrams of illustrate an exemplary embodiment of a method of forming a CMOS architecture using a flash anneal process.
Figure 4B:
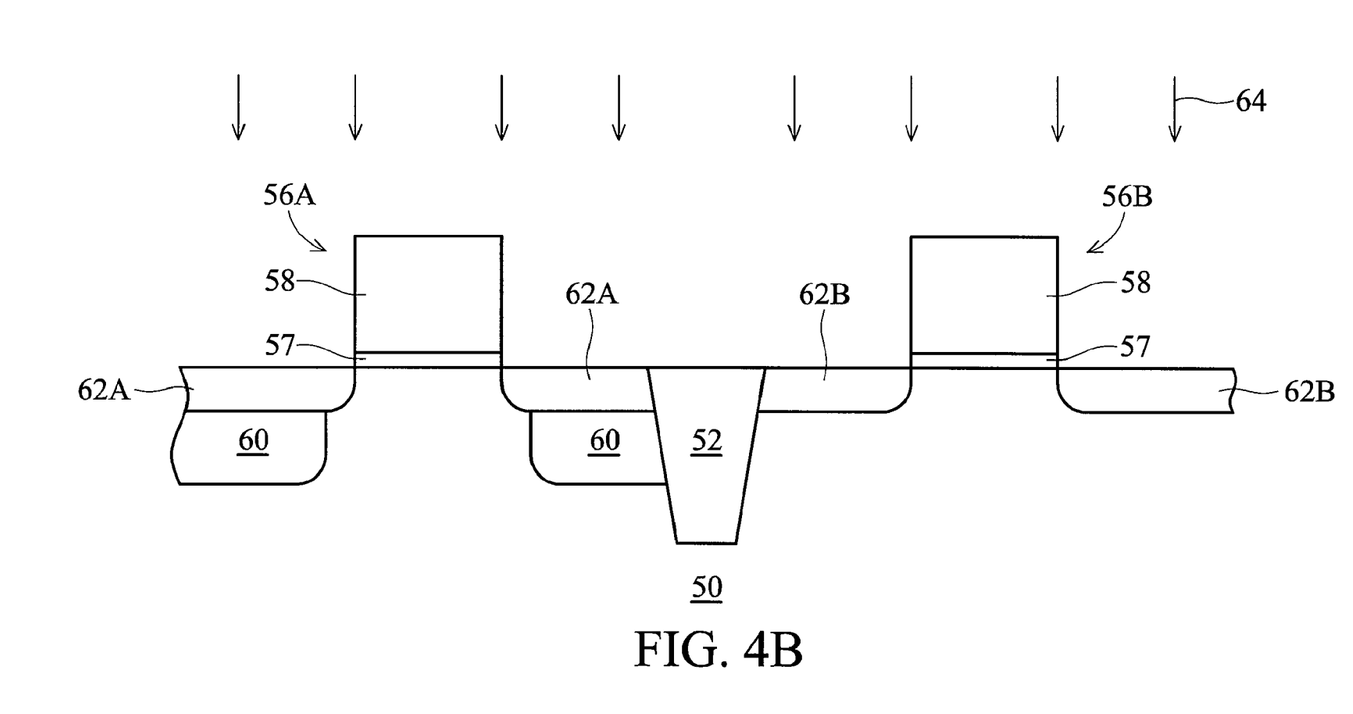
Figure 4C:
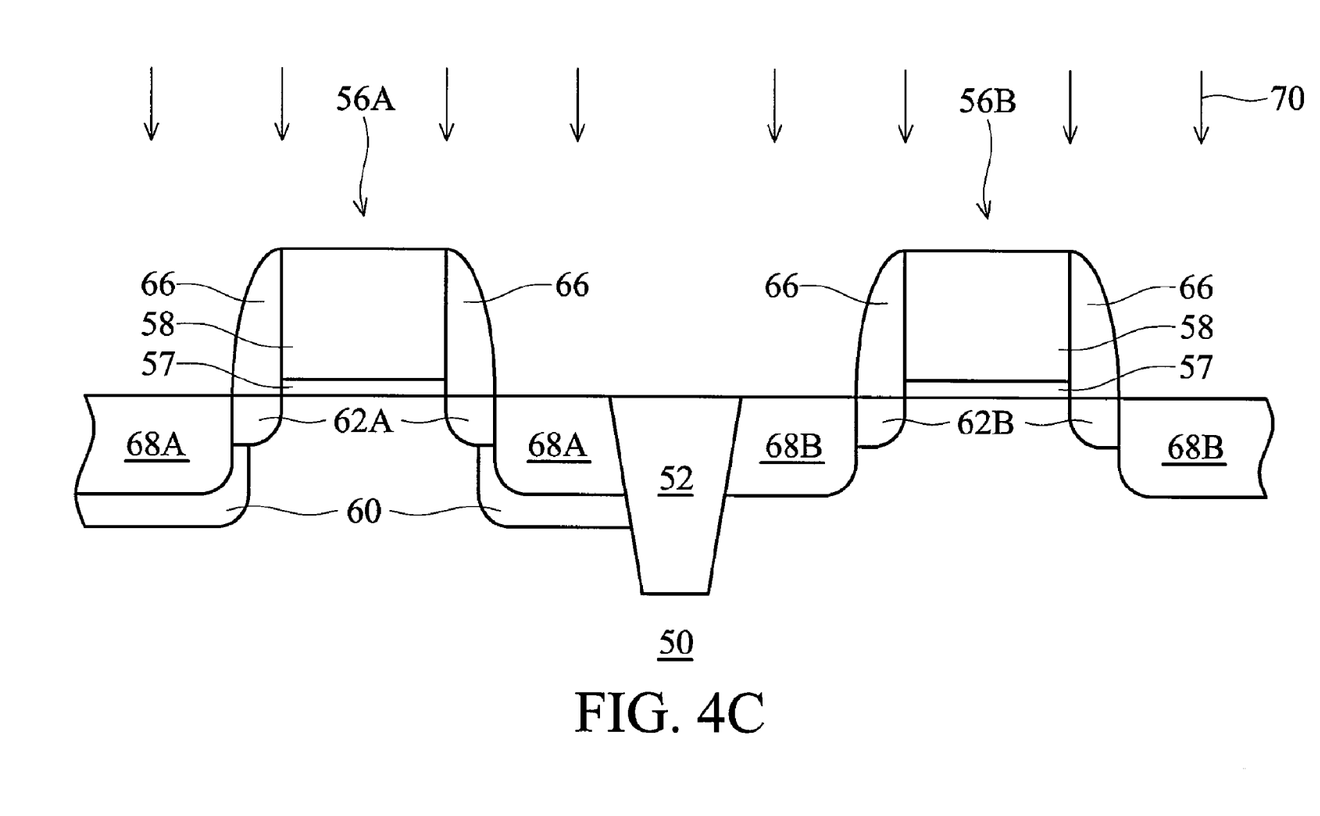

FIGS. 4A to 4C are cross-sectional diagrams of illustrate an exemplary embodiment of a method of forming a CMOS architecture using a flash anneal process. Referring to Figure. 4A, a semiconductor substrate 50 comprises isolation structures 52 for isolating a pMOS device region 54A and an nMOS device region 54B. The nMOS and pMOS devices may be fabricated on a P-well and N-well structure, and may be fabricated directly onto or within the semiconductor substrate. In the present example, the isolation structure 52 between the nMOS and pMOS device may utilize isolation technology, such as local oxidation of silicon (LOCOS) and shallow trench isolation (STI).

The semiconductor substrate 50 is bulk silicon, but other commonly used materials and structures such as silicon on insulator (SOI) or a silicon layer overlying a bulk silicon germanium may also be used. Two gate structures 56A and 56B separated by the isolation structure 52 are formed on the semiconductor substrate 50 within the pMOS device region 54A and the nMOS device region 54B respectively. Each of the gate structures 56A and 56B includes a gate dielectric layer 57 and a gate electrode layer 58. The gate dielectric layer 57 may be formed of silicon oxide or a high-k dielectric material. The gate electrode layer 58 may be formed of amorphous polysilicon, doped polysilicon, metal, single crystalline silicon or other conductive materials.

Referring to FIG. 4A, a photoresist is applied over the nMOS device region 54B to expose areas in the pMOS device region 54A available for subsequent recess etching. Recessed areas for the pMOS device region 54A are then formed in the semiconductor substrate 50 by etching isotropically and/or anisotropically. The photoresist is then stripped to expose the nMOS device region 54B. Through epitaxial growth in the recessed area, epitaxy regions 60 are therefore completed. For example by known CVD methods at high temperature, e.g. 650~850° C., SiGe epitaxy regions are formed in the pMOS device region 54A. The SiGe epitaxy regions will introduce a compressive stress in the channel region so that the pMOS device drive current will be enhanced.

Referring to FIG. 4B, a P-pocket/P-LDD implantation is performed on the pMOS device region 54A to form source/drain extension regions 62A in the substrate 50 on opposing sides of the gate structure 56A. Similarly, an N-pocket/N-LDD implantation is performed on the nMOS device region 54B to form source/drain extension regions 62B in the substrate 50 on opposing sides of the gate structure 56B. Next, a flash anneal process 64 is performed to activate impurities in the substrate 50. In the flash anneal process 64, a radiation energy source is a filament-less lamp, such as a Xe arc lamp in white-light wavelength area, which gives off light suddenly or substantially instantaneous for a duration of time between about 1~3 msec. In on e embodiment, the flash anneal process 64 can be replaced by a laser anneal process.

In FIG. 4C, dielectric spacers 66 are formed on the sidewalls of the gate structures 56A and 56B respectively, and then source/drain regions 68A and 68B are formed in the substrate 50 by ion implantation process with the gate structures 56A and 56B and the dielectric spacers 66 as the mask. On the pMOS device region 54A, impurities are implanted into the substrate 50 to form source/drain regions 68A. On the nMOS device region 54B, impurities are implanted into the substrate 50 to form source/drain regions 68B. A post-implant anneal process 70 is then performed to drive in the impurity ions. The post-implant anneal process 70 uses a rapid thermal anneal (RTA) process 70 at a temperature of between 900° C. and 1050° C. for a time of between about 1~30 seconds in a nitrogen containing atmosphere. In one embodiment, the temperature of the RTA process 70 can be lower than 900° C. for junction depth control. An optional flash anneal process or laser anneal process may be provided after the RTA process 70 to further increase dopant activation, and thus results in additional Rs reduction.

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A method of forming a semiconductor device, comprising:
   providing a semiconductor substrate having a gate structure patterned thereon;
   performing a first ion implantation process to form source/drain extension regions in said semiconductor substrate on opposing sides of said gate structure;
   performing a first anneal process on said source/drain extension regions;
   forming dielectric spacers on sidewalls of said gate structure respectively;
   performing a second ion implantation process with said gate structure and said dielectric spacers as the mask to form source/drain regions in said semiconductor substrate;
   performing a third ion implantation process before performing said first anneal process and after performing said first ion implantation process to form halo regions in said semiconductor substrate in contact with said source/drain extension regions;
   performing a second anneal process on said source/drain regions; and
   performing a third anneal process on said semiconductor substrate after performing said second anneal process;
   wherein, said first anneal process is a flash anneal process performed for a time of between about 1 millisecond and 3 milliseconds, said second anneal process is a rapid thermal anneal process performed at a temperature lower than 900° C. for a time of between about 1 second and 30 seconds, and said third anneal process is a laser anneal process.

2. The method of claim 1, wherein said first anneal process uses a Xe flash lamp.

3. The method of claim 1, wherein said second ion implantation process is performed at a dopant concentration greater than that of said first ion implantation process.

4. The method of claim 1, wherein said source/drain extension regions and said source/drain regions are formed of a first conductive type, and said halo regions are formed of a second conductive type different from said first conductive type.

5. A method of forming a semiconductor device, comprising:
   providing a semiconductor substrate having a gate structure patterned thereon;
   performing a first ion implantation process to form source/drain extension regions in said semiconductor substrate on opposing sides of said gate structure;
   performing a first anneal process on said source/drain extension regions;
   forming dielectric spacers on sidewalls of said gate structure respectively;
   performing a second ion implantation process with said gate structure and said dielectric spacers as the mask to form source/drain regions in said semiconductor substrate;
   performing a third ion implantation process before performing said first anneal process and after performing said first ion implantation process to form halo regions in said semiconductor substrate in contact with said source/drain extension regions;

performing a second anneal process on said source/drain regions; and performing a third anneal process on said semiconductor substrate after performing said second anneal process;

wherein, said first anneal process and said third anneal process are laser anneal processes, and said second anneal process is a rapid thermal anneal process performed at a temperature lower than 900° C.

6. The method of claim 5, wherein said second ion implantation process is performed at a dopant concentration greater than that of said first ion implantation process.

7. The method of claim 5, wherein said source/drain extension regions and said source/drain regions are formed of a first conductive type, and said halo regions are formed of a second conductive type different from said first conductive type.

* * * * *